United States Patent [19]

Kinbara

[11] Patent Number: 5,260,607
[45] Date of Patent: Nov. 9, 1993

[54] SNUBBER CIRCUIT FOR POWER CONVERTER

[75] Inventor: Yoshihide Kinbara, Aichi, Japan

[73] Assignee: Mitsubishi Denki K.K., Tokyo, Japan

[21] Appl. No.: 858,573

[22] Filed: Mar. 27, 1992

[30] Foreign Application Priority Data

Mar. 27, 1991 [JP] Japan .................................. 3-63002

[51] Int. Cl.⁵ ...................... H02H 7/125; H03K 17/60
[52] U.S. Cl. ..................................... 307/253; 307/571;
307/633; 363/56
[58] Field of Search ........................ 307/253, 571, 633;
363/56; 361/91, 111

[56] References Cited

U.S. PATENT DOCUMENTS

| | | | |
|---|---|---|---|
| 4,414,479 | 11/1983 | Foley | 307/253 |
| 4,783,727 | 11/1988 | Neumann | 363/56 |
| 4,805,079 | 2/1989 | Van Buul | 363/56 |
| 4,922,365 | 5/1990 | Mori | 363/56 |

FOREIGN PATENT DOCUMENTS

| | | | |
|---|---|---|---|
| 0085572 | 5/1982 | Japan | 307/633 |
| 58-6078 | 1/1983 | Japan . | |
| 0165957 | 9/1984 | Japan | 307/633 |
| 0226385 | 2/1990 | Japan . | |
| 2-194726 | 8/1990 | Japan . | |

Primary Examiner—William L. Sikes
Assistant Examiner—Toan Tran
Attorney, Agent, or Firm—Sughrue, Mion, Zinn, Macpeak & Seas

[57] ABSTRACT

A snubber circuit for a DC chopper-type power converter having a power supply and a switching circuit connected to a load, the switching circuit comprising a switch and a diode, and the snubber circuit having a combination of capacitances, diodes and inductances to direct and store currents and voltages during the ON-/OFF operation of the switch. A surge current and voltage suppressing capability is provided by the series connection of an inductor or reactor between the switch and the diode in the switching circuit, with the load circuit being connected at either end of the inductor or reactor element. Further, the snubber may be arranged as two parallel series circuits, one containing the switch, inductor and diode and another containing additional diodes and inductance. Resonance suppression may be provided by the further addition of a capacitor between the inductor in the first series circuit and the diodes in the second series circuit. The power converter may be any of a voltage-raising chopper type, a voltage dropping chopper type, a voltage reversible chopper type, a CUK type and a forward type, and may be embodied as a half-bridge inverter.

24 Claims, 13 Drawing Sheets

FIG. 2(a)
FIG. 2(b)
FIG. 2(c)
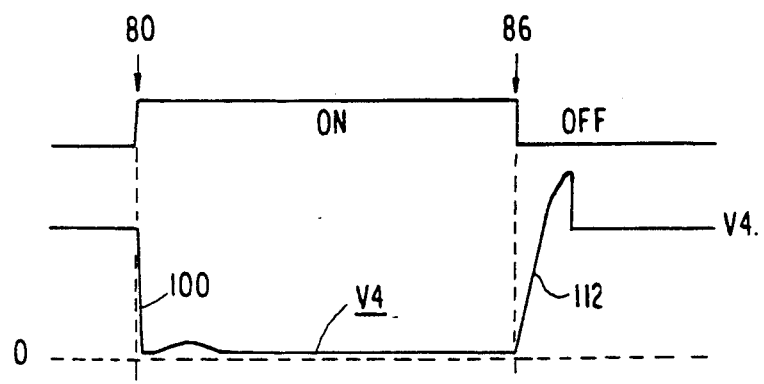
FIG. 2(d)
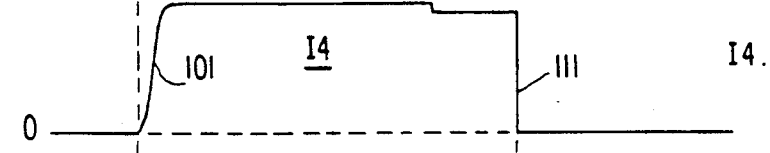
FIG. 2(e)
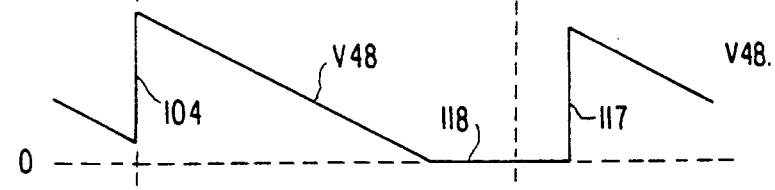
FIG. 2(f)
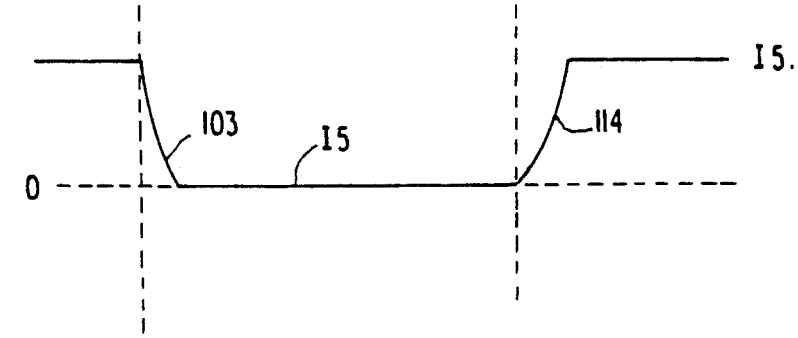

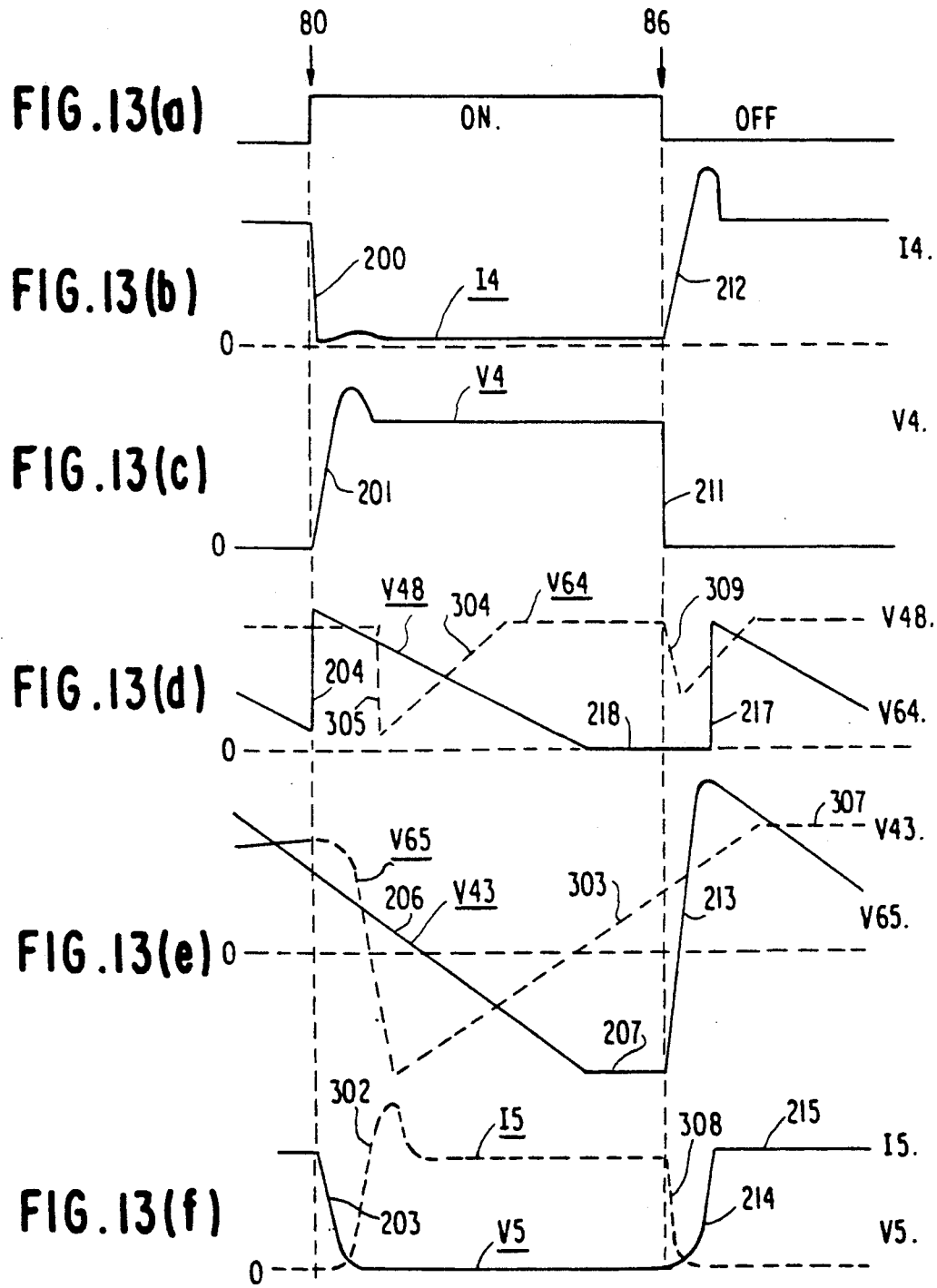

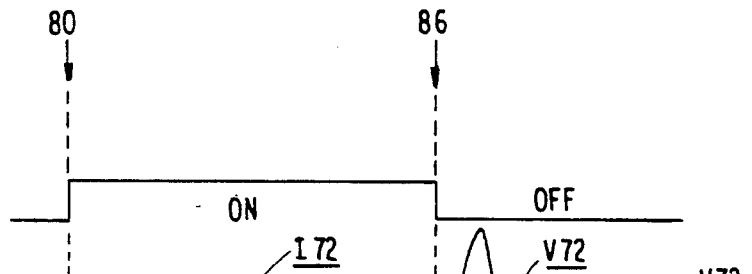
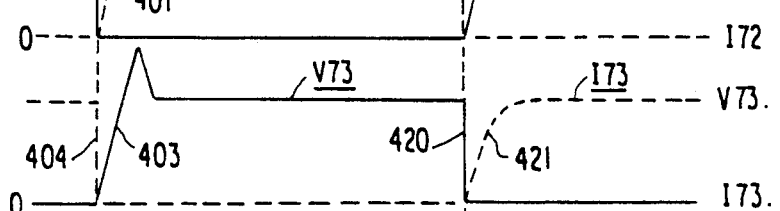
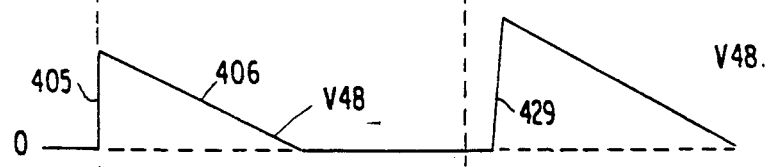
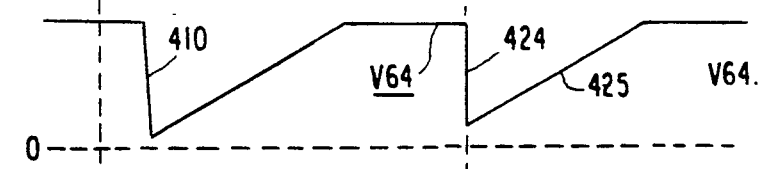
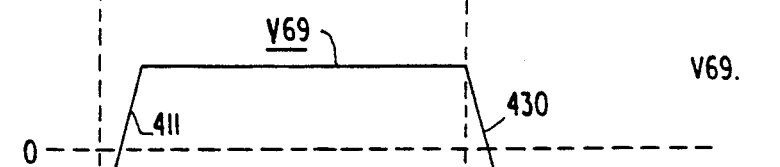
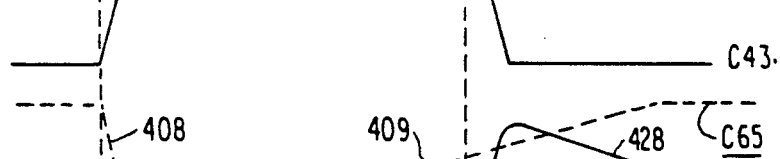
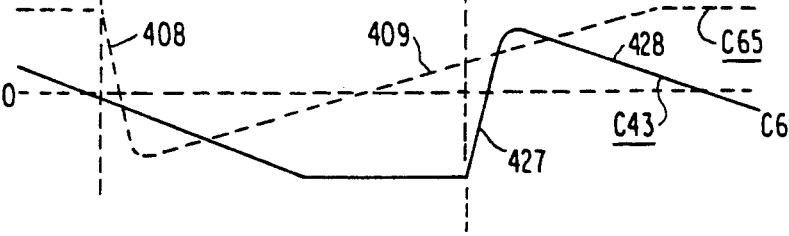

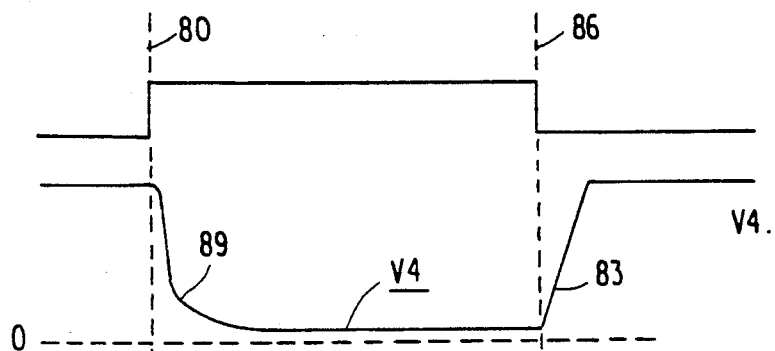
FIG.19(a)
FIG.19(b)
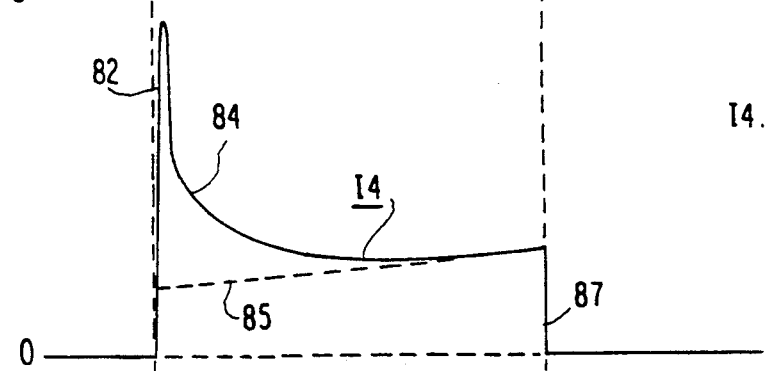
FIG.19(c)
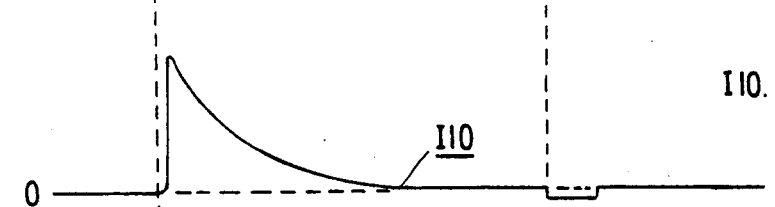
FIG.19(d)
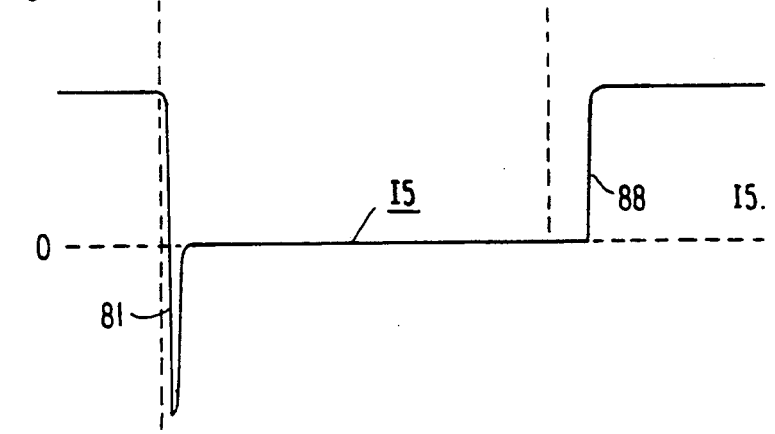
FIG.19(e)

SNUBBER CIRCUIT FOR POWER CONVERTER

BACKGROUND OF THE INVENTION

1. Field of the Invention

The present invention relates to a snubber circuit for a power converter for reducing switching loss in the power converter.

2. Description of the Prior Art

FIG. 18 shows an example of a conventional snubber circuit employed in a voltage-dropping chopper circuit, a type of a power converter, wherein a DC power supply 1, has a first side of a switching element 4 connected to its positive power supply terminal 2. The switching element 4 uses an electronic switch such as an MOSFET, a transistor, an IGBT or a static induction transistor (SIT). A diode 5 is connected between the second side of the switching element 4 and a negative power supply terminal 3 of the DC power supply 1. A DC reactor 7 is connected to a connection point 6 of the second side of switching element 4 and the diode 5, which are connected in series. A load 8 is connected to the DC reactor 7 in a series circuit between terminal 3 and point 6. A conventional snubber circuit 12, comprising a capacitor 9 connected in series with the parallel arrangement of a resistor 10 and a diode 11, is connected across the connection point 6 and the power supply terminal 2.

FIGS. 19(a)-19(e) show waveform charts for illustrating the operation of the known snubber circuit employed in the voltage-dropping chopper circuitry in FIG. 18. FIG. 19(a) indicates ON/OFF operation of the switching element 4. FIG. 19(b) illustrates a voltage waveform thereof. FIG. 19(c) illustrates a current waveform thereof, FIG. 19(d) illustrates a current waveform of the resistor 10, and FIG. 19(e) illustrates a current waveform of the diode 5.

The operation of the conventional snubber circuit will now be described in accordance with FIGS. 19(a)-19(e). As shown in FIG. 19(a), when the switching element 4 is turned ON at time 80, a current which was flowing in a loop, consisting of the diode 5, the DC reactor 7 and the load 8, begins to flow in the load 8 through the switching element 4 via the DC reactor 7. At the instant 80 that the switching element 4 is switched from OFF to ON, a very large surge current caused by the recovery characteristic of the diode 5 flows in the diode 5 in an opposite direction as indicated by 81 in FIG. 19(e). Accordingly, as indicated by 82 in FIG. 19(c), a large surge current flows through the switching element 4 when the switching element 4 is turned ON.

The voltage of the connection point 6 rises when the switching element 4 is turned ON. As a result, a current flows in the resistor 10 through the capacitor 9. At this time, a current does not flow in the diode 11 since its direction is opposite. The current flowing in the resistor 10 is shown in FIG. 19(d). As illustrated, the peak value of the current flowing in the resistor 10 depends on the value of the resistor 10 and the voltage of the DC power supply 1, and the attenuation time constant of the current depends on the resistor 10 and the capacitor 9. Namely, the attenuation time constant is determined so that the capacitor 9 discharges while the switching element 4 is ON. The capacity of the capacitor 9 depends on the rise ratio (dv/dt) of the switching element 4 voltage indicated by 83 in FIG. 19(b) at a time when the switching element 4 is turned OFF. Hence, as the operating frequency of the voltage-dropping chopper circuitry is higher in frequency, the resistor 10 value becomes smaller. As in a current waveform 82 of the switching element 4 shown in FIG. 19(c), therefore, when the switching element 4 is switched ON, a sum of the recovery surge Current 81 of the diode 5, a current 84 flowing in the resistor 10 of the snubber circuit 12, and a current 85 flowing in the DC reactor 7 flows in the switching element 4. Moreover, the ON voltage of the switching element 4 is relatively high as indicated by 89 in FIG. 19(b) and there is a period when both the current and voltage are high.

As shown in FIG. 19(a), when the switching element 4 is switched OFF at time 86, the voltage of the switching element 4 attempts to rise, but the current flows through the diode 11 and the capacitor 9 of the snubber circuit 12 and restricts the voltage rise ratio (dv/dt) of the switching element 4 as indicated by 83 in FIG. 19(b). This immediately causes the switching element 4 current to be zeroed as indicated by 87 in FIG. 19(c). Since the switching element 4 voltage is zero at this time, the switching loss of the switching element 4 does not occur. When the voltage of the capacitor 9 has reached that of the DC power supply 1, the diode 5 is switched ON as indicated by 88 in FIG. 19(e) and the current keeps flowing in the DC reactor 7.

FIG. 20 shows an example of a conventional snubber circuit used in a half-bridge inverter circuit, a type of a power converter, wherein a load 8 is connected between a connection point 6 in a series circuit, comprising two switching elements 31 and 32 which are connected in parallel with a series circuit of DC power supplies 29, 30, and a connection point 33 of the DC power supplies 29, 30. Further, a snubber circuit 20, comprising a capacitor 21, a resistor 22 and a diode 23, is connected in parallel with the switching element 31, and also a snubber circuit 25, comprising a capacitor 26, a resistor 27 and a diode 28, is connected in parallel with the switching element 32.

When the switching element 32 is switched OF and the switching element 31 is switched ON in the half-bridge inverter circuitry shown in FIG. 20, a current which was flowing in the switching element 32 and the load 8 then begins to flow in the load 8 through the switching element 31. At this time, a very large surge current flows due to the recovery characteristic of the switching element 32 or of an opposite-direction diode (not illustrated) externally installed. In addition, the switching element 31 switched ON forces the voltage of the connection point 6 to rise and a current to flow in the resistor 22 through the capacitor 21. At this time, the current does not flow in the diode 23 because it is connected in the opposite direction. Further, a current flows in the diode 28 through the capacitor 26. Since this circuit does not have a resistor component, a large current will flow if the switching speed is high.

As described above, when the switching element 31 is switched ON, a sum of the recovery surge current of the switching current 32, the current flowing in the capacitor 26 and the diode 28 of the snubber circuit 25, the current flowing in the capacitor 21 and the resistor 22 of the snubber circuit 20, and the current flowing in the load 8 flows in the switching element 31. Accordingly, a very large surge current flows when the switching element 31 is switched ON. Similarly, a very large surge current also flows when the switching element 32 is switched ON. Moreover, since the currents are large, the ON voltages of the switching elements 31, 32 are high and there is a period when both the current and voltage are high.

In the conventional snubber circuits for a power converter designed as described above, for example, the snubber circuit 12 shown in FIG. 18, the switching element 4 experiences an extremely high switching loss. This loss is due to the fact that the sum of (i) the recovery surge current of the diode 5, (ii) the current flowing in the resistor 10 of the snubber circuit 12, and (iii) the current flowing in the DC reactor 7, flows in the switching element 4 when the switching element 4 is turned ON. Also, the ON voltage of the switching element 4 is comparatively high, and there is a period when both the current and voltage are high. In addition, because of the high recovery current flowing in the diode 5, the snubber circuit 12 also has a large switching loss at the diode 5 and the current flowing in the resistor 10 all turns into heat (loss). Concerning the snubber circuits 20, 25 shown in FIG. 20, since very large surge currents flow and the ON voltages are high when the switching elements 31, 32 are turned ON, the switching loss is very large and the currents flowing in the resistors 22, 27 all change into heat (loss). Accordingly, a power converter employing these snubber circuits will be low in efficiency.

SUMMARY OF THE INVENTION

The object of the present invention is to overcome the disadvantages in the conventional snubber circuit by providing a snubber circuit for use in a power converter which will reduce switching loss.

According to an embodiment of the invention, a snubber circuit for a power converter circuit, having a switching element, a power supply and a first diode, is provided wherein a first inductor is connected in series with the first diode and also a series circuit of a second diode, a second inductor and a third diode and a capacitor are provided to restrict a surge current to the first diode when the switching element is switched ON, suppress the current rise ratio of the switching element, and rapidly reduce the potential thereof, and also to nearly zero the current of the switching element when it is switched OFF and suppress the potential rise ratio thereof, and to further allow the surplus energy at the time of switching to be returned to the DC power supply, thereby ensuring small switching loss and high efficiency.

According to another embodiment of the invention, a fourth diode is inserted between the connection point of the first inductor and the first diode and the power supply terminal connected with the switching element to suppress the occurrence of a high voltage resulting from series resonance between the first inductor and the first diode junction capacitance and to prevent the first diode from being damaged by overvoltage, thereby ensuring high reliability.

According to a further embodiment of the invention, a second capacitor is inserted between the power supply terminal connected with the switching element and the power supply side of the third diode to prevent the snubber circuit from malfunctioning due to wiring inductance, thereby increasing the freedom of working for ease of wiring work and ensuring high reliability at relatively low costs.

According to yet another embodiment of the invention, the second switching element is inserted between the connection point of the second diode and the second inductor and the power supply side of the third diode to control the current of the second inductor to be not less than a predetermined value, thereby nearly zeroing the current of the first switching element at the instant that the first switching element is switched OFF, minimizing switching loss in a wide continuity ratio range, and ensuring high performance and high efficiency.

According to an additional embodiment of the invention, the first inductor is connected in series with the first diode, the first capacitor is inserted between the connection point of the second inductor and the fourth diode and the connection point of the switching element and the first inductor, and the second capacitor is inserted between the connection point of the second diode and the third diode and the connection point of the first inductor and the first diode to nearly zero the current of said switching element and ensure small switching loss in a wide continuity ratio range, high performance, and high efficiency, and also to suppress the occurrence of a high voltage resulting from series resonance between said first inductor and the first diode junction capacitance, prevent the first diode from being damaged by overvoltage, and ensure high reliability.

According to another embodiment of the invention, the first and the second inductors are inserted in series between the first and the second switching elements to suppress the current rise ratio of the first or second switching element and rapidly reduce the potential when one of said switching elements is switched ON. Also the series circuit consisting of the first and the second diodes, the second inductor and the third diode, and the first and the second capacitors are provided to nearly zero the current of said first or second switching element rapidly, suppress the potential thereof when it is switched OFF, and also suppress the occurrence of a high voltage resulting from series resonance between the other switching element and the series-connected inductors, thereby ensuring small switching loss, high efficiency and high reliability.

Other modifications of the preferred embodiments would be apparent and are described or suggested.

BRIEF DESCRIPTION OF THE DRAWINGS

FIGS. 2(a)–(f) show waveform charts illustrating the operation of the snubber circuit shown in FIG. 1.

FIGS. 13(a)-13(f) show waveform charts illustrating the operation of the snubber circuit shown in FIG. 12.

FIGS. 15(a)-15(f) show waveform charts illustrating the operation of the snubber circuit shown in FIG. 12.

FIGS. 19(a)-19(f) show waveform charts illustrating the operation of the snubber circuit shown in FIG. 17.

DESCRIPTION OF THE PREFERRED EMBODIMENTS

Figure 1:
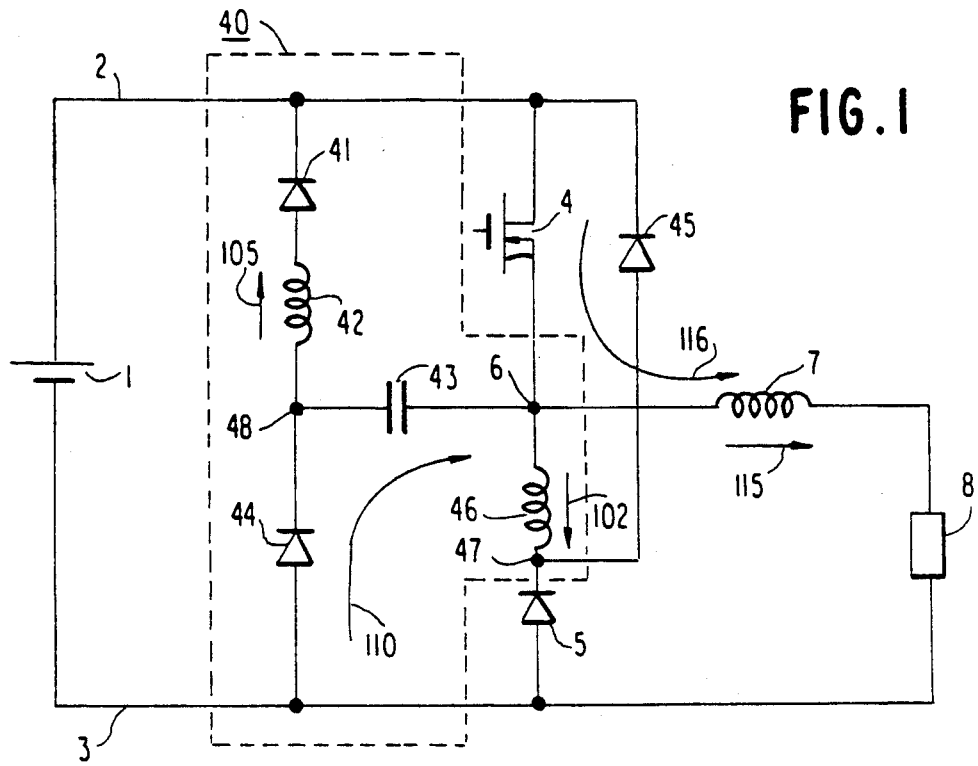
FIG. 1 is a circuit diagram of a voltage-dropping chopper circuitry equipped with a snubber circuit according to a first and second embodiment of the invention.

A first embodiment will now be described in reference to FIG. 1 and FIG. 2, wherein identical reference characters to the conventional design designate identical or corresponding parts thereto.

FIG. 1 illustrates a snubber circuit in accordance with the first embodiment employing a voltage-dropping chopper circuitry, a type of a power converter. Referring now to FIG. 1, the numeral 40 indicates a snubber circuit that is connected across a power supply 1, having terminals 2 and 3, and is connected between the power supply and a power converter circuit, comprising a diode 5, switch 4, reactor 7 and load 8. The snubber circuit comprises an inductor 46, acting as a first inductor connected between the switching element 4 and the diode 5. The snubber circuit 40 also has connected between power supply terminals 2 and 3, a series circuit consisting of a diode 41, serving as a second diode, an inductor 42 as a second inductor and a diode 44 as a third diode. Finally, the snubber circuit has a capacitor 43 connected between a connection point 48 of the inductor 42 and the diode 44 and a connection point 6. The switching element 4 comprises an electronic switch, such as a MOSFET, a transistor, an IGBT or an SIT.

FIGS. 2(a)-2(f) show waveform charts illustrating the operation of the snubber circuit employed in the voltage-dropping circuitry in FIG. 1. FIG. 2(a) indicates ON/OFF operation of the switching element 4, FIG. 2(b) indicates a voltage waveform thereof, FIG. 2(c) illustrates a current waveform thereof, FIG. 2(d) shows a voltage waveform of the connection point 48, FIG. 2(e) shows a voltage waveform of the capacitor 43, and FIG. 2(f) illustrates a current waveform of the diode 5.

The operation of the snubber circuit 40 will now be described in accordance with FIG. 2. When the switching element 4 is switched ON at time 80 as indicated in FIG. 2(a), the current of the switching element 4 indicated by 101 in FIG. 2(c) increases at an increase-ratio which is determined substantially by the inductance of the inductor 46. The moment the switching element 4 is switched ON, its current is zero and its voltage decreases rapidly as indicated by 100 in FIG. 2(b). FIG. 2(f) indicates the current of the diode 5. As indicated by 103 in FIG. 2(f), the inductance of the inductor 46 prevents a surge current from flowing from the switching element 4 to the diode 5, thereby reducing the current immediately according to the recovery time of the diode 5. Accordingly, switching loss resulting from the recovery of the diode 5 can be lowered.

When the switching element 4 is turned ON, a current flows through the capacitor 43, the inductor 42 and the diode 41. At this time, the voltage waveform of the capacitor 43 is as shown in FIG. 2(e) and that of the connection point 48 as shown in FIG. 2(d). When the switching element 4 is switched ON, the voltage of the connection point 48 rises to a sum of the capacitor 43 charging voltage and the DC power supply 1 voltage as indicated by 104 in FIG. 2(d). At this time, the diode 44 remains OFF. The inductor 42 is preset to a considerably large inductance so that a current may flow therein continuously. Therefore, a current 105 flowing in the inductor 42 charges the capacitor 43 to lower the voltage of the connection point 48 down to the potential of the power supply terminal 3. At this time, the voltage waveform of the capacitor 43 is as indicated by 106 in FIG. 2(e). In FIG. 2(e), the voltage 107 of the capacitor 43 is constant at a time when the diode 44 is switched ON and the current flows in the diode 44, the inductor 42 and the diode 41, and the potential of the connection point 48 is kept at that of the power supply terminal 3. Immediately before the switching element 4 is switched OFF, the capacitor 43 is set to a state in which the connection point 48 has been connected to the potential of the power supply terminal 3 and the connection point 6 is connected to that of the power supply terminal 2, i.e. is charged to the voltage of the DC power supply 1.

The operation of the snubber circuit at a time when the switching element 4 is switched OFF will now be described. As shown in FIG. 2(a), when the switching element 4 is turned OFF at time 86, the current 116 flowing in the switching element 4 and the DC reactor 7 to the load 8 stops flowing, and instead, a current 110 passes the diode 44 and the capacitor 43 and flows to the load 8 via the DC reactor 7. Accordingly, the current of the switching element 4 is zeroed rapidly as indicated by 111 in FIG. 2(c). Also as indicated by 112 in FIG. 2(b), the rise ratio of the switching element 4 voltage depends on the capacitor 43 capacity and the current 110. This current 110 causes the voltage of the capacitor 43 to rise as indicated by 113 in FIG. 2(e). When the voltage of the switching element 4 has risen as indicated by 112 in FIG. 2(b), the voltage of the connection point 6 lowers to a negative voltage. When the voltage of the connection point 6 has turned to a negative voltage, the current begins to flow in the diode 5 and flows to the DC reactor 7 through the inductor 46. As indicated by 114 in FIG. 2(f), therefore, the current of the diode 5 reaches the level of the current 115 flowing in the DC reactor 7 at the current rise ratio determined by the inductor 46.

The instant the switching element 4 is turned OFF, its voltage is zero volts as indicated by 112 in FIG. 2(b) and its current rapidly approaches zero as indicated by 111 in FIG. 2(c). Hence, when the switching element 4 is switched OFF, the switching loss is also very small. In addition, since the current of the diode 5 also rises slowly as indicated by 114 in FIG. 2(f) before the diode 5 is switched ON, the switching loss and noise are small. The current 110 which flows after the switching element 4 is switched OFF forces the capacitor 43 to be charged, and the voltage of the connection point 6 rises from a negative value to nearly zero when the diode 5 is switched ON. Therefore, the voltage of the connection point 48 rises to a voltage charged by the capacitor 43 as indicated by 117 in FIG. 2(d), and causes the current 105 to flow in the inductor 42. Since this current 105 is returned to the DC power supply 1, power loss is very small as compared to the known snubber circuit wherein that current is consumed by the resistor as heat.

Whereas the series circuit of the DC reactor 7 and the load 8 is connected to the connection point 6 of the switching element 4 and the inductor 46 in FIG. 1, it may be connected to the connection point 47 of the inductor 46 and the diode 5 to produce an identical effect. Also, the inductor 46 may be a saturable reactor.

As described above, the snubber circuit 40 in the power converter according to the first embodiment reduces switching loss by zeroing the current of the switching element 4 when it is switched ON and zeroing the voltage thereof when it is switched OFF, and also reduces the switching loss of the diode 5 resulting from the suppression of a surge current caused by recovery occurring when the diode 5 is switched OFF. Moreover, surplus energy accumulated in the capacitor 43 by switching is returned to the DC power supply 1 as the current 105 to reduce the switching loss, thereby providing a power converter which is extremely high in power efficiency. Further, the snubber circuit 40 is allowed to operated if the ON or OFF time of the switching element 4 changes, providing a power converter which allows power control to be carried out by pulse width control.

In the first embodiment, a further characteristic may be added to the circuit by connecting a diode 45 as a fourth diode between the connection point 47 and the power supply terminal 2 in FIG. 1. Returning to FIG. 1, the diode 45 connected across the power supply terminal 2 and the connection point 47 suppresses a high voltage, which is caused by series resonance between the junction capacitance of the diode 5 and the inductor 46 at the moment the diode 5 is switched OFF, during the recovery time after the switching element 4 is switched ON, thereby preventing the diode 5 from being damaged by the high voltage. In addition, the connection of a capacitor having about the same electrostatic capacity as the diode 5 junction capacitance in parallel with the diode 5 allows the series resonance frequency to be lowered and the voltage occurring in the diode 5 to be reduced.

Figure 3:
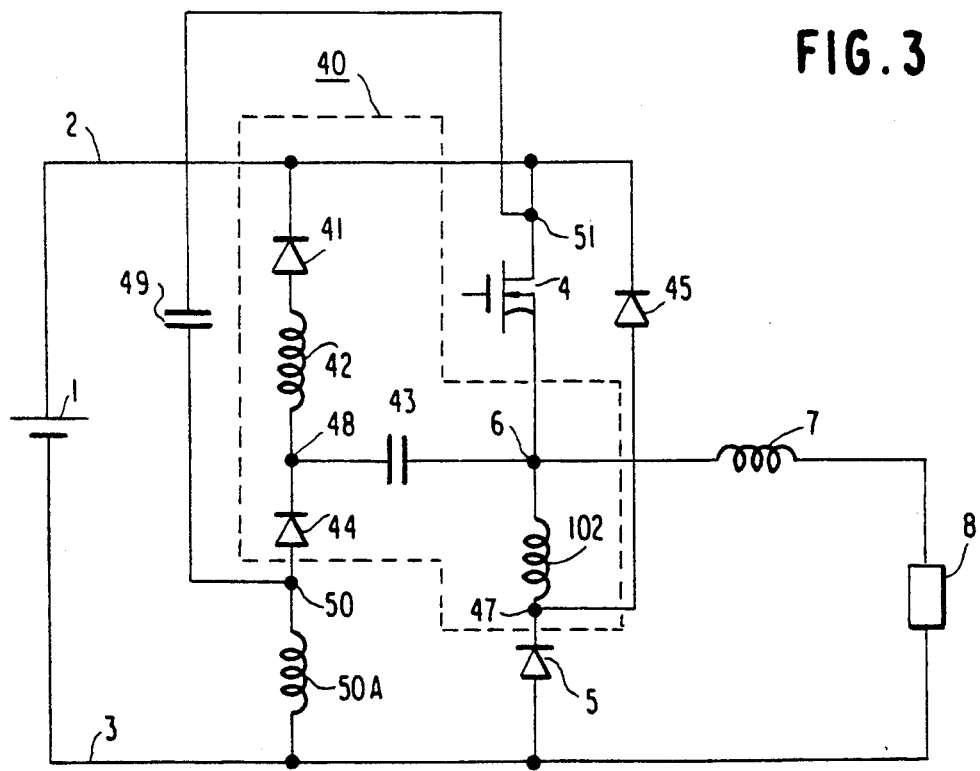
FIG. 3 is a circuit diagram of a voltage-dropping chopper circuitry equipped with a snubber circuit according to a second embodiment of the invention.

A second embodiment will now be described in reference to FIG. 3, wherein a second capacitor 49 is inserted between a connection point 50 in the vicinity of the anode of a diode 44 and a connection point 51 on the power supply terminal 2 side connected with the switching element 4. FIG. 3 is different from FIG. 1 in that the capacitor 49 connects the connection points 50 and 51, the points being connected by capacitor 49 at the shortest wiring distance. If the wiring distance between the diode 44 and the DC power supply 1 is long, a wiring inductance 50A may cause a surge voltage or may not allow the snubber circuit to operate properly By connecting the capacitor 49 between the connection point 50 in the neighborhood of the diode 44 anode and the connection point 51 on the power supply terminal 2 side connected with the switching element 4 at the shortest distance as described above, the snubber circuit 40 can be operated properly if the wiring inductance 50A is large.

Figure 4:
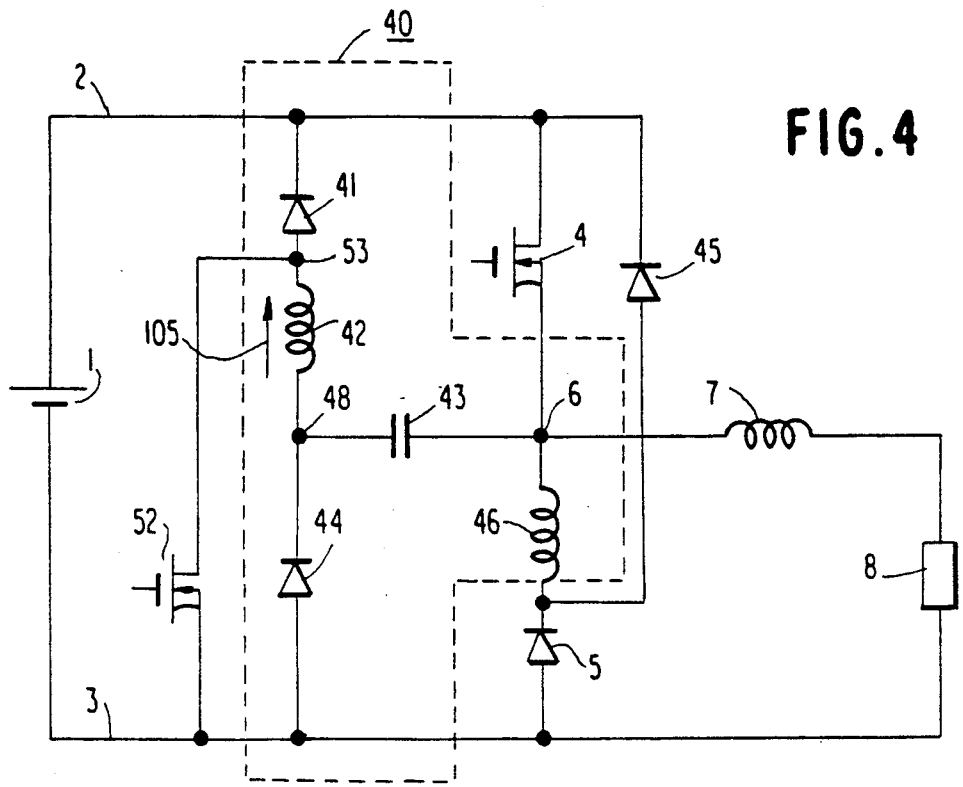
FIG. 4 is a circuit diagram of a voltage-dropping chopper circuitry equipped with a snubber circuit according to a third embodiment of the invention.

A third embodiment will now be described with reference to FIG. 4, wherein 52 indicates a second switching element connected between a connection point 53 of the inductor 42 and the diode 41 and the power supply terminal 3 of the DC power supply 1. FIG. 4 differs from FIG. 1 in that the switching element 52 is employed. When the current 105 of the inductor 42 falls below a predetermined value, the switching element 52 is switched ON to increase the inductor 42 current, thereby controlling the current to be not less than a certain value.

In the above structure, the capacitor 43 charging current is controlled so that, as indicated by 118 in FIG. 2(d), the connection point 48 voltage is reduced to the potential of the power supply terminal 3 before the switching element 4 is turned OFF to ensure that the voltage at the moment the switching element 4 is switched OFF is zeroed. The switching element 52 for controlling the current of the inductance 42 allows the switching loss in the ON or OFF period of the switching element 4 to be zero over a long period of time. Especially when the ON period of the switching element 4 is short, the current 105 of the inductor 42 is increased to make the voltage of the connection point 48 identical to the potential of the power supply terminal 3 before the switching element 4 is switched OFF, thereby allowing the zero range of the switching loss to be wider.

Figure 5:
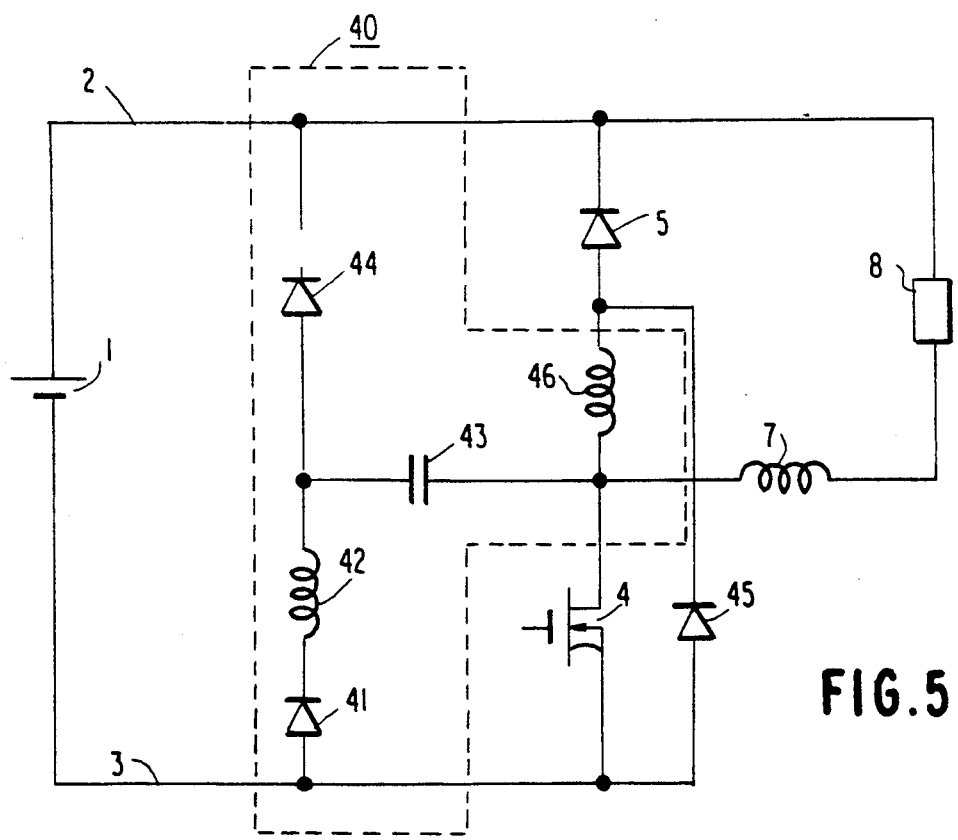
FIG. 5 is a circuit diagram of a voltage-dropping chopper circuitry equipped with a snubber circuit according to a fourth embodiment of the invention.

FIG. 5 shows another embodiment of the invention and is different from the first embodiment of FIG. 1 in that the switching element 4 and the diode 5 connected to the power supply terminals 2 and 3 of the DC power supply 1 have been exchanged. As illustrated in FIG. 5, the snubber circuit 40 comprises the series circuit of the diode 41 and the inductor 42, the diode 44, the capacitor 43 and the inductor 46, and operates in an identical manner as in the first embodiment.

Figure 6:
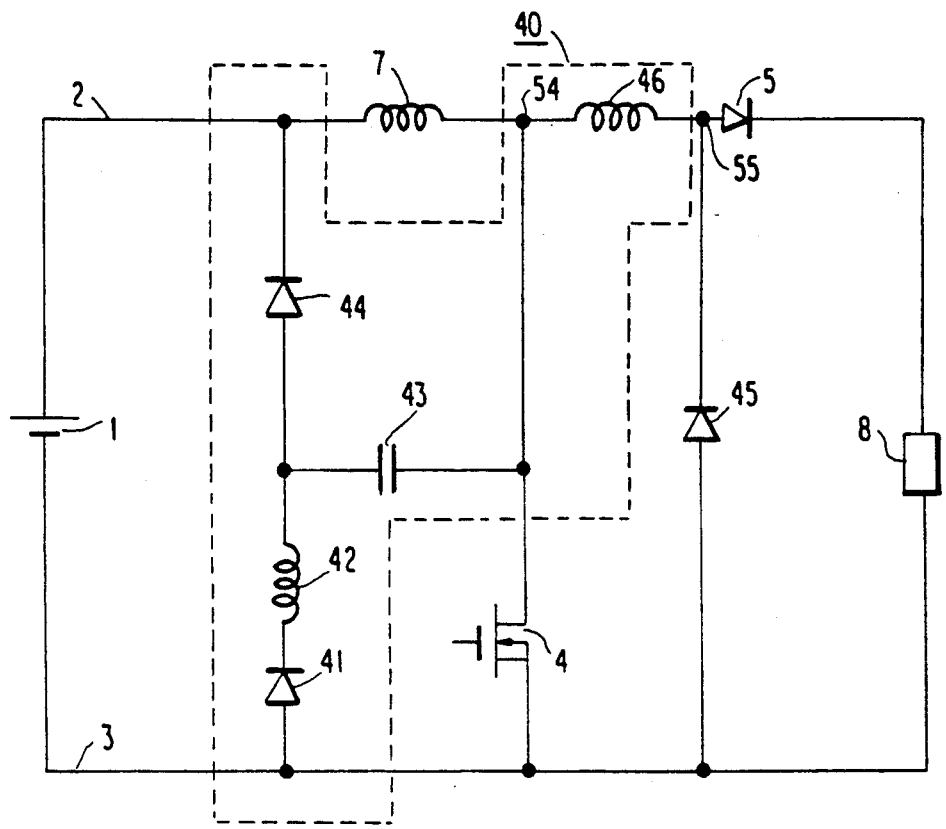
FIG. 6 is a circuit diagram of a voltage-raising chopper circuitry equipped with a snubber circuit according to a fifth embodiment of the invention.

FIG. 6 illustrates a further embodiment according to the invention, i.e. a snubber circuit applied to a voltage-raising chopper circuitry, wherein the DC reactor 7 is connected between the power supply terminal 2 of the DC power supply 1 and the switching element 4, a series circuit of the inductor 46 and the diode 5 is connected between a DC reactor 7-and-switching element 4 connection point 54 and the load 8, and the diode 45 is connected between connection point 55 Of the inductor 46 and diode 5 and the power supply terminal 3. This voltage-raising chopper circuit allows a voltage higher than that of the DC power supply 1 to be supplied to the load 8 according to the continuity ratio of the switching element 4. The snubber circuit 40 comprises the series circuit of the diode 41 and the inductor 42, the diode 44, the capacitor 43 and the inductor 46, and operates in the same manner as in the first embodiment.

Figure 7:
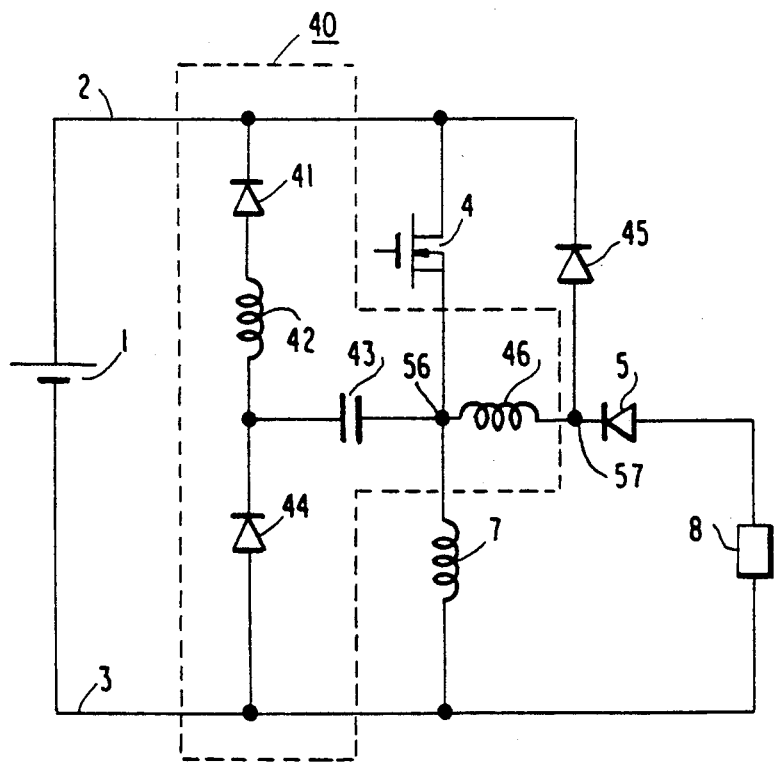
FIG. 7 is a circuit diagram of a voltage-raising/dropping chopper circuitry equipped with a snubber circuit according to a sixth embodiment of the invention.

FIG. 7 shows a sixth embodiment according to the present invention, i.e. a snubber circuit applied to a voltage-raising/dropping chopper circuitry, wherein the DC reactor 7 is connected between the power supply terminal 3 of the DC power supply 1 and the switching element 4, the series circuit of the inductor 46 and the diode 5 is connected between a DC reactor 7 and switching element 4 connection point 56 and the load 8, and the diode 45 is connected between an inductor 46 and diode 5 connection point 57 and the power supply terminal 2. This voltage-raising/dropping chopper circuit supplies a negative voltage to the load 8 according to the continuity ratio of the switching element 4. The snubber circuit 40 comprises the series circuit of the diode 41 and the inductor 42, the diode 44, the capacitor 43 and the inductor 46, and operates in the same way as in the first embodiment.

Figure 8:
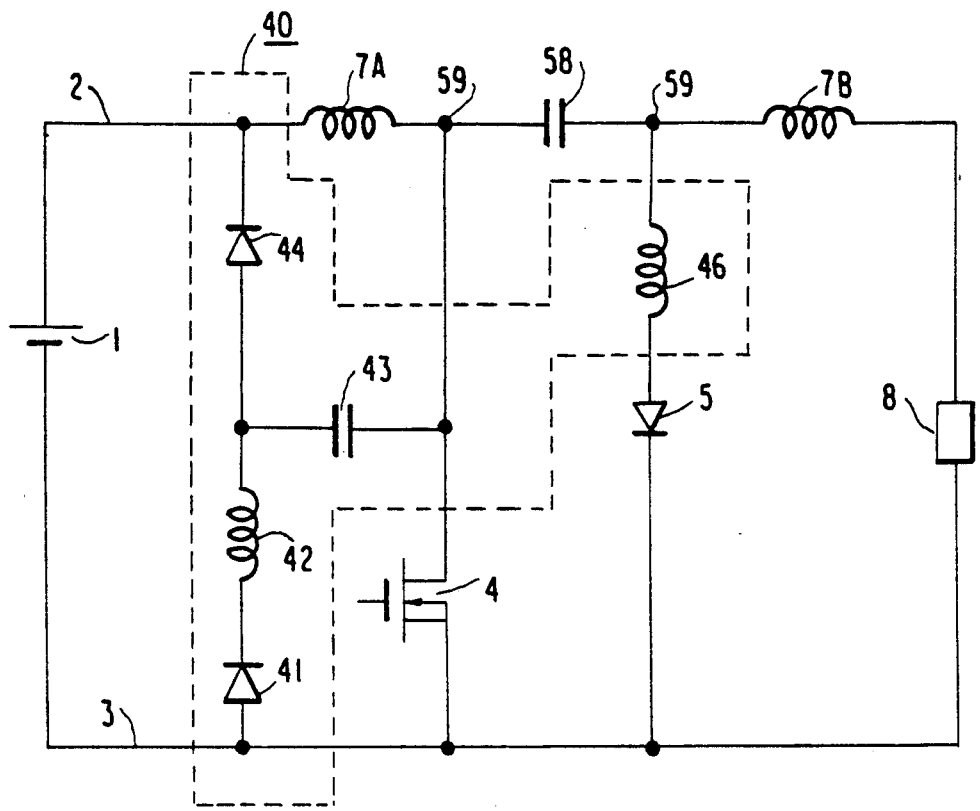
FIG. 8 is a circuit diagram of a CUK converter circuitry equipped with a snubber circuit according to a seventh embodiment of the invention.

FIG. 8 illustrates a seventh embodiment of the invention, i.e. a snubber circuit applied to a CUK converter, wherein a DC reactor 7A is connected between the power supply terminal 2 of the DC power supply 1 and the switching element 4, a series circuit of a capacitor 58 and a DC reactor 7B is connected between a DC reactor 7A and switching element 4 connection point 59 and the load 8, and the inductor 46 and the diode 5 are connected in series between a capacitor 58 and DC reactor 7B connection point 59 and the power supply terminal 3. This CUK converter supplies a negative voltage to the load 8 according to the ON-ratio of the switching element 4. The snubber circuit 40 comprises the series circuit of the diode 41 and the inductor 42, the diode 44, the capacitor 43 and the inductor 46, and operates in an identical manner as in the first embodiment.

Figure 9:
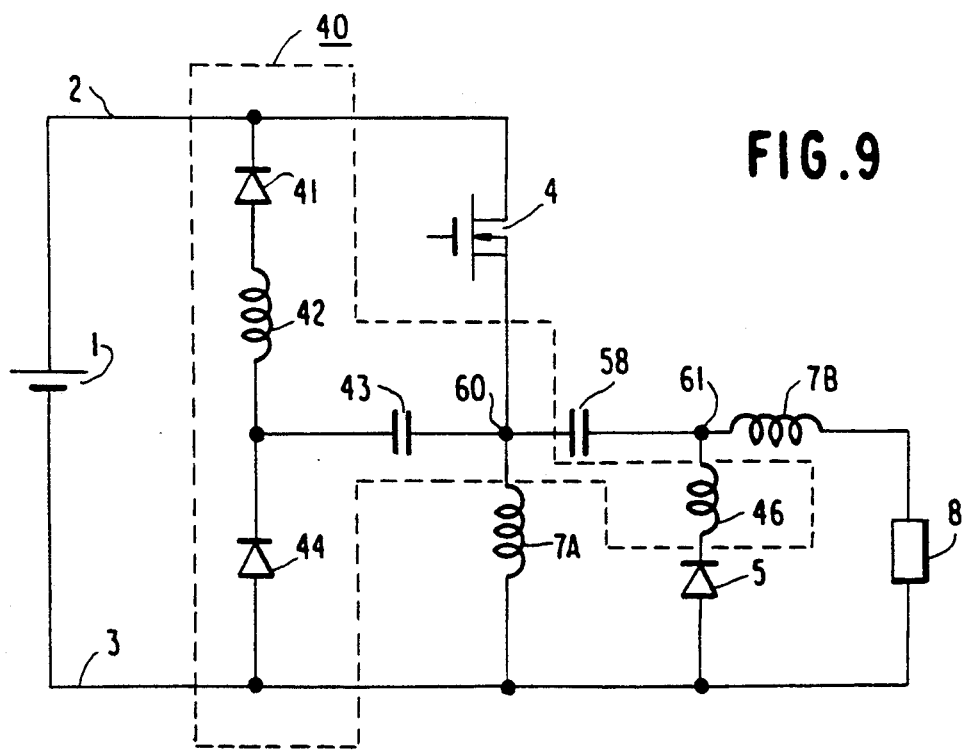
FIG. 9 is a circuit diagram of a CUK converter modification circuitry equipped with a snubber circuit according to an eighth embodiment of the invention.

FIG. 9 illustrates an eighth embodiment of the invention, i.e. a snubber circuit applied to a CUK converter modification circuitry, wherein the DC reactor 7A is connected between the power supply terminal 3 of the DC power supply 1 and the switching element 4, the series circuit of the capacitor 58 and the DC reactor 7B is connected between a DC reactor 7A and switching element 4 connection point 60 and the load 8, and the inductor 46 and the diode 5 are connected in series between a capacitor 58 and DC reactor 7B connection point 61 and the power supply terminal 3. This CUK converter modification circuit supplies a positive voltage to the load 8 according to the continuity ratio of the switching element 4. The snubber circuit 40 comprises the series circuit of the diode 41 and the inductor 42, the diode 44, the capacitor 43 and the inductor 46, and operates as described in the first embodiment.

Figure 10:
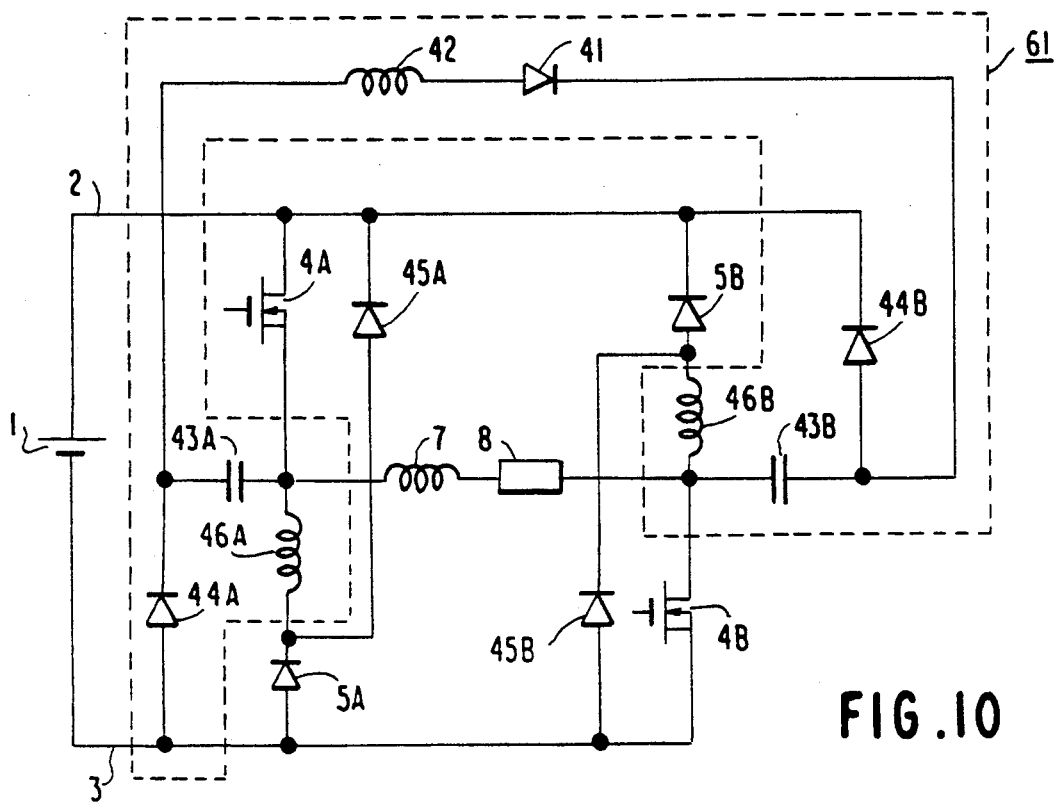
FIG. 10 is a circuit diagram of a voltage-reversible chopper circuitry equipped with a snubber circuit according to a ninth embodiment, which is a further modification of the previously described embodiments.

FIG. 10 shows a ninth embodiment, which is a further modification of the first and fifth embodiments, i.e. a snubber circuit applied to a voltage reversible chopper circuitry employing a voltage-dropping chopper circuit illustrated in FIG. 1 and FIG. 5. This embodiment uses the series circuit of the inductor 42 and the diode 41 and the series circuit of the DC reactor 7 and the load 8 in FIG. 1 and FIG. 5. The voltage-dropping chopper circuit comprising a switching element 4A, a diode 5A and the DC reactor 7 operates as described in FIG. 1 and the voltage-dropping chopper circuit comprising a switching element 4B, a diode 5B and the DC reactor 7 operates as described in FIG. 5. Accordingly, an equivalent of a difference between the voltage-dropping chopper circuits shown in FIG. 1 and FIG. 5 is applied to the load 8. A snubber circuit 61 comprises the series circuit of the diode 41 and the inductor 42, a diode 44A, a capacitor 43A, an inductor 46A, a diode 44B, a capacitor 43B and an inductor 46B.

Figure 11:
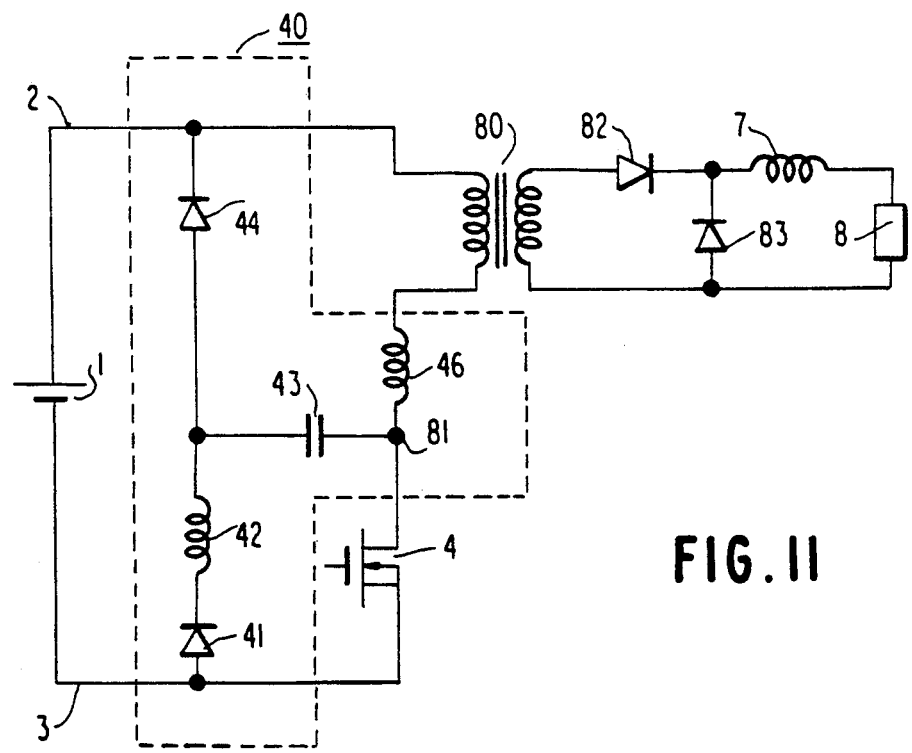
FIG. 11 is a circuit diagram of a forward converter circuitry equalized with a snubber circuit according to a tenth embodiment of the invention.

FIG. 11 shows a tenth embodiment according to the invention, i.e. the snubber circuit 40 in accordance with the present invention applied to a forward type converter. The primary coil of a transformer 80, the inductor 46 and the switching element 4 are connected as a series circuit between the power supply terminals 2 and 3 of the DC power supply 1, and diodes 82, 83, the DC reactor 7 and the load 8 are connected to the secondary coil of the transformer 80. The inductor 46 may be the stray inductance of the transformer 80. The forward type converter supplies the load 8 with a voltage which is determined by the continuity ratio of the switching element 4 and the turn ratio of the transformer 80. The snubber circuit 40 comprises the series circuit of the diode 41 and the inductor 42, the diode 44, the capacitor 43 and the inductor 46, and operates as described in the first embodiment.

Figure 12:
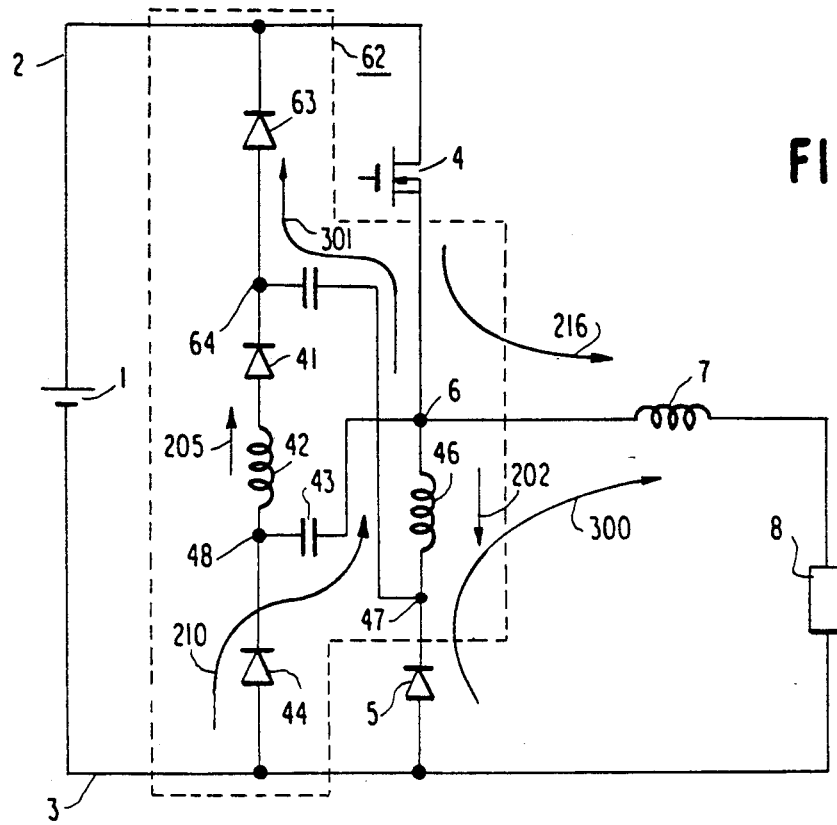
FIG. 12 is a circuit diagram of a voltage-dropping chopper circuitry equipped with a snubber circuit according to an eleventh embodiment, which is a modification of a previously described embodiment.

As modification of the fifth embodiment, a snubber circuit employed in a voltage-dropping chopper circuitry, which is a kind of a power converter, will now be described in accordance with the eleventh embodiment of FIGS. 12 and FIG. 13. Referring now to FIG. 12, 62 indicates a snubber circuit comprising: the inductor 46 as a first inductor connected between the switching element 4 and the diode 5; a series circuit consisting of a diode 63 as a second diode connected between the power supply terminals 2 and 3, the third diode 41, the inductor 42 as a second inductor and the diode 44 as a fourth diode; the capacitor 43 as a first capacitor connected between the inductor 42 and diode 44 connection point 48 and the connection point 6; and a second capacitor connected between a diode 63 and diode 41 connection point 64 and the inductor 46 and first diode 5 connection point 47.

FIGS. 13(a)-13(f) shows waveform charts for illustrating the operation of the voltage-dropping chopper circuitry shown in FIG. 12, wherein FIG. 13(a) indicates ON/OFF operation of the switching element 4, FIG. 13(b) a voltage waveform thereof, FIG. 13(c) a current waveform thereof, FIG. 13(d) a voltage waveform (continuous line) of the connection point 48 and a voltage waveform (dotted line) of the connection point 64, FIG. 13(e) a voltage waveform (continuous line) of the capacitor 43 and a voltage waveform (dotted line) of the capacitor 65, and FIG. 13(f) a current waveform (continuous line) and a voltage waveform (dotted line) of the diode 5.

The operation of the present embodiment will now be described. The fundamental operation of the snubber circuit 62 at the time of the switching element 4 ON/-OFF operation is substantially identical to the operation of the snubber circuit 40 shown in FIG. 2. Namely, as illustrated in FIG. 13(a), when the switching element 4 is turned ON at time 80, the current of the switching element 4 indicated by 201 in FIG. 13(c) increases at an increase ratio substantially determined by the inductance of the inductor 46. In this case, the inductance of the DC reactor 7 is much larger than that of the inductor 46. The moment the switching element 4 is switched ON, its current is zero and its voltage falls rapidly as indicated by 200 in FIG. 13(b). The inductance of the inductor 46 does not cause a surge current to flow into the diode 5 from the switching element 4, thus immediately reducing the current as indicated by 203 in FIG. 13(f) in response to the recovery time of the diode 5. In other words, when the diode 5 is switched OFF, the voltage of the connection point 47 rises as indicated by 302 in FIG. 13(f), thereby decreasing the switching loss caused by the recovery of the diode 5.

When the diode 5 is switched OFF, the voltage of the connection point 47 rises and the current flows through the capacitor 65 and the diode 63. At this time, the voltage waveform of the capacitor 65 is as shown in FIG. 13(e) (dotted line) and the voltage of the connection point 64 is as indicated by 304 (dotted line) in FIG. 13(d). When the diode 5 is switched OFF, the voltage of the connection point 64 falls down to nearly the potential of the power supply terminal 3 as indicated by 305 in FIG. 13(d). At this time, the diode 63 is turned OFF. The inductor 42 is preset to a considerably large inductance so that a current which will flow therein may be continuous. Hence, a current 205 flowing in the inductor 42 charges the capacitor 65 and keeps flowing to raise the voltage of the connection point 64 up to the potential of the power supply terminal 2. The voltage waveform of the capacitor 65 is indicated by 303 in FIG. 13(e), with the connection point 64 positive. 307 in FIG. 13(e) indicates that the diode 63 is switched ON, the current flows, e.g. from the diode 44 to the inductor 42 to the diode 41 to the diode 63, and the voltage of the connection point 64 is kept at the potential of the power supply terminal 2. The capacitor 65 is in a state wherein the connection point 64 is connected with the potential of the power supply terminal 2 and the connection point 6 connected with that of the power supply terminal 3, i.e. is charged at the voltage of the DC power supply 1.

Now, as indicated in FIG. 13(a), when the switching element 4 is switched OFF at time 86, a current 216 which was flowing from the switching element 4 and the DC reactor 7 to the load 8 begins to flow as a current 210 to the DC reactor 7 through the diode 44 and the capacitor 43. Therefore, the current of the switching element 4 is rapidly zeroed as indicated by 211 in FIG. 13(c). Also, as indicated by 212 in FIG. 13(b), the rise ratio of the switching element 4 voltage depends on the capacitor 43 and the current 210.

The instant the switching element 4 is switched OFF, its voltage is zero as indicated by 212 in FIG. 13(b) and its current is rapidly zeroed as indicated by 211 in FIG. 13(c). Therefore, when the switching element 4 is switched OFF, switching loss is extremely small. In addition, since the current of the diode 5 also rises slowly as indicated by 214 in FIG. 13(f) before the diode 5 is switched ON, the switching loss and noise are small. Further, the current 210 which flows after the switching element 4 is switched OFF causes the capacitor 43 to be charged, and the voltage of the connection point 6 rises from a negative value to nearly zero volts when the diode 5 is switched ON. Hence, the voltage of the connection point 48 rises to a voltage charged by the capacitor 43 as indicated by 217 in FIG. 13(d), and causes the flow of current 205 to increase in the inductor 42. Further, when the switching element 4 is switched OFF at 86, the diode 5 is switched ON as indicated by 214 in FIG. 13(f) to start a current. When the diode 5 is switched ON, the voltage of the connection point 6 drops to nearly zero volts as indicated by 308. Therefore, because the connection point 64 is connected with the capacitor 65, its voltage falls as indicated by 309 in FIG. 13(d) and increases the current 205 of the inductor 42. Since this current 205 is returned to the DC power supply 1, power loss is very small as compared to the known snubber circuit wherein that current is consumed by the resistor as heat.

While the DC reactor 7 and the load 8 are connected to the connection point 6 of the switching element 4 and the inductor 46, the DC reactor 7 may be connected to the connection point 47 to produce an identical effect. Also, the inductor 46 may be a saturable reactor.

As described above, the snubber circuit 62 in the power converter according to the present embodiment reduces switching loss by zeroing the current of the switching element 4 when it is switched ON and zeroing the voltage thereof when it is switched OFF, and reduces the switching loss of the diode 5 resulting from the suppression of the surge current caused by recovery occurring when the diode 5 is switched OFF. Moreover, surplus energy accumulated in the capacitor 43 by switching is returned to the DC power supply 1 to reduce the switching loss, thereby providing a power converter which is extremely high in power efficiency. Further, the snubber circuit 62 prevents overvoltage caused by the resonance of the diode 5 and the inductor 46 connected in series therewith from occurring by the operation of the capacitor 65, providing a highly reliable power converter. Furthermore, allowed to operate if the ON or OFF time of the switching element 4 changes, the snubber circuit 62 provides a power converter allowing power control to be carried out by pulse width or other conventional control.

As a twelfth embodiment of the invention, a snubber circuit employed in a half-bridge inverter circuitry as a power converter will now be described with reference to FIG. 14, wherein a switching element 72 as a first switching element is connected to the power supply terminal 2 of the DC power supply 1, a switching element 73 as a second switching element is connected to the power supply terminal 3, a series circuit of inductors 75 and 74 as a first and a second inductors is connected between the switching elements 72 and 73, and the load 8 is connected to a connection point 69 of the inductors 75 and 74. The other end of the load 8 is connected to a connection point 71 of a series circuit of capacitors 66 and 67 connected between the power supply terminals 2 and 3. 76 indicates a snubber circuit comprising the diode 63 as a first diode connected to the power supply terminal 2, the diode 44 as a second diode connected to the power supply terminal 3, a series circuit of the diode 41 and the inductor 42 connected between the diode 63 and the diode 44, the capacitor 43 as a first capacitor connected between the inductor 42-and-diode 44 connection point 48 and a connection point 68, a capacitor 65 as a second capacitor connected between a diode 41 and diode 63 connection point 64 and a connection point 70, and a series circuit of the inductors 75 and 74.

Figure 14:
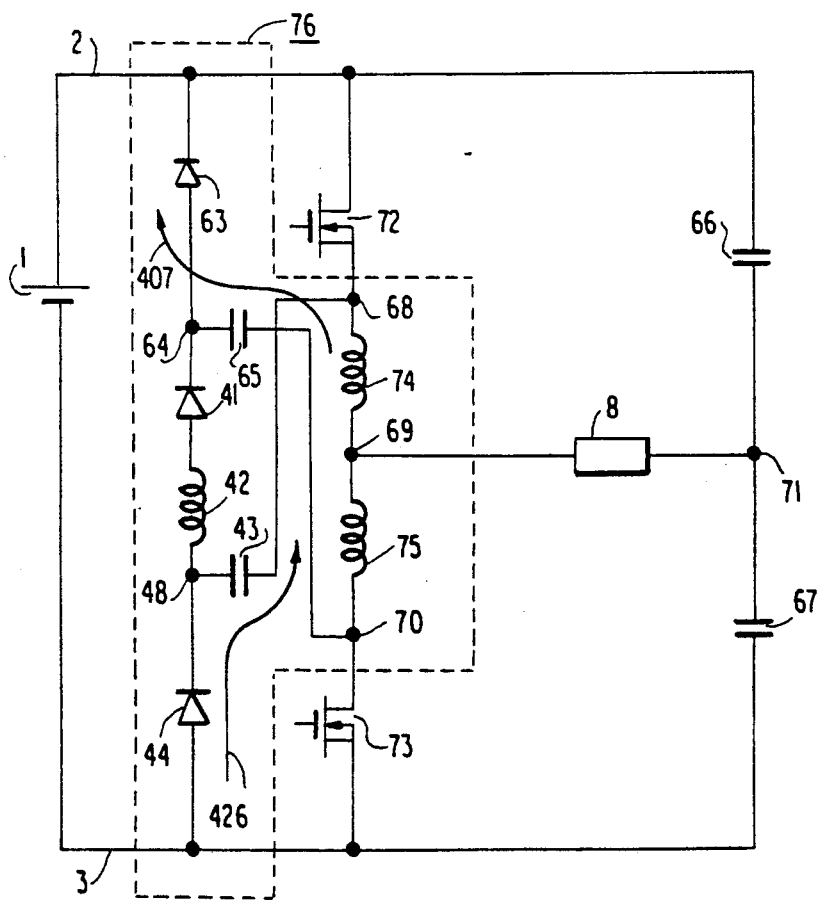
FIG. 14 is a circuit diagram of a half-bridge inverter circuitry equipped with a snubber circuit according to a twelfth embodiment of the invention.

FIGS. 15(a)–15(g) shows waveform charts for illustrating the operation of the half-bridge inverter circuitry shown in FIG. 14, wherein FIG. 15(a) indicates ON/OFF operation of the switching element 72, FIG. 15(b) a voltage waveform (continuous line) and a current waveform (dotted line) thereof, FIG. 15(c) a voltage waveform (continuous line) and a current waveform (dotted line) of the switching element 73, FIG. 15(d) a voltage waveform of the connection point 48, FIG. 15(e) a voltage waveform of the connection point 64, FIG. 15(f) an output voltage waveform provided to the connection point 69, i.e. the load 8, and FIG. 15(g) a voltage waveform (continuous line) of the capacitor 43 and a voltage waveform (dotted line) of the capacitor 65.

The operation of the present embodiment will now be described. The switching element 72 is switched ON at 80, and at the same time, the switching element 73 is switched OFF. The voltage of the switching element 72 is rapidly zeroed as indicated by 401 in FIG. 15(b), and its current increases at an increase ratio determined by the inductor 74 as indicated by 402 in FIG. 15(b). The voltage of the switching element 73 rises at an increase ratio determined by the capacitor 65 and an output current value as indicated by 403 in FIG. 15(c), and its current is rapidly zeroed as indicated by 404 in FIG. 15(c).

Since the switching element 72 is switched ON, the voltage of the connection point 48 is raised as indicated by 405 in FIG. 15(d) through the capacitor 43 by the voltage rise of the connection point 68. Since the capacitor 43 is then charged by the current flowing in the inductor 42, the voltage of the connection point 48 drops to the potential of the power supply terminal 3 as indicated by 406 in FIG. 15(d). The voltage of the connection point 64 is as shown in FIG. 15(e) and a current 407 flows through the capacitor 65 and the diode 63 while the voltage of the switching element 73 is rising as indicated by 403 in FIG. 15(c), and the voltage of the capacitor 65 is rapidly charged as indicated by 408 in FIG. 15(g). This voltage is then charged as indicated by 409 in FIG. 15(g) by the current flowing in the inductor 42. It is finally charged up to the potential of the power supply terminal 2. When the voltage of the switching element 73 has finished rising as indicated by 403 in FIG. 15(c), the voltage of the connection point 64 falls as indicated by 410 in FIG. 15(e) since the diode 63 is switched OFF and the voltage charged in the capacitor 65 is applied in series to the voltage of the connection point 69 or the output point to the load 8.

Through the above operation, the voltage of the connection point 69, or the output voltage, rises as indicated by 411 in FIG. 15(f) to output a positive voltage. At this time, switching loss is small because the current of the switching element 72 is zero when it is switched ON and the voltage of the switching element 73 is zero when it is switched OFF.

When the switching element 72 is switched OFF at 86, and at the same time, the switching element 73 is switched ON, the voltage of the switching element 73 is rapidly zeroed as indicated by 420 in FIG. 15(c) and its current increases at an increase ratio determined by the inductor 75 as indicated by 421 in FIG. 15(c). The voltage of the switching element 72 increases at an increase ratio determined by the capacitor 43 and an output current value as indicated by 423 in FIG. 15(b) and its current is rapidly zeroed as indicated by 422 in FIG. 15(b). At the connection point 64, since the switching element 73 is switched ON, the voltage of the connection point 64 is dropped as indicated by 424 in FIG. 15(e) through the capacitor 65 by the voltage drop at 70. Since the capacitor 65 is then charged by the current flowing in the inductor 42, the voltage of the connection point 65 rises to the potential of the power supply terminal 2 as indicated by 425. The voltage of the connection point 48 is as shown in FIG. 15(d) and a current 426 flows through the diode 44 and the capacitor 43 while the voltage of the switching element 72 is rising as indicated by 423, and the voltage of the capacitor 43 is rapidly charged as indicated by 427 in (g).

The voltage of the capacitor 43 is then charged as indicated by 428 in FIG. 15(g) by the current flowing in the inductor 42, and is finally charged up to the potential of the power supply terminal 3. Further, when the voltage of the switching element 72 has finished rising as indicated by 423 in FIG. 15(b), the voltage of the connection point 48 rises as indicated by 429 in FIG. 15(d) because the diode 44 is switched OFF and the voltage charged in the capacitor 43 is applied in series to the voltage of the connection point 69 or the output point to the load 8.

Through the above operation, the voltage of the connection point 69, or the output voltage, is inversed as indicated by 430 in FIG. 15(f). At this time, switching loss is small since the current of the switching element 73 is zero when it is switched ON and the voltage of the switching element 72 is zero when it is switched OFF. In addition, surplus energy accumulated in the capacitors 43, 65 by switching is returned to the DC power supply 1, thereby providing a power converter which is extremely high in power efficiency. Further, the snubber circuit 76 according to the present invention is allowed to operate if the ON or OFF time of the switching elements changes, providing an inverter which allows power control to be carried out by pulse width control, etc.

Figure 16:
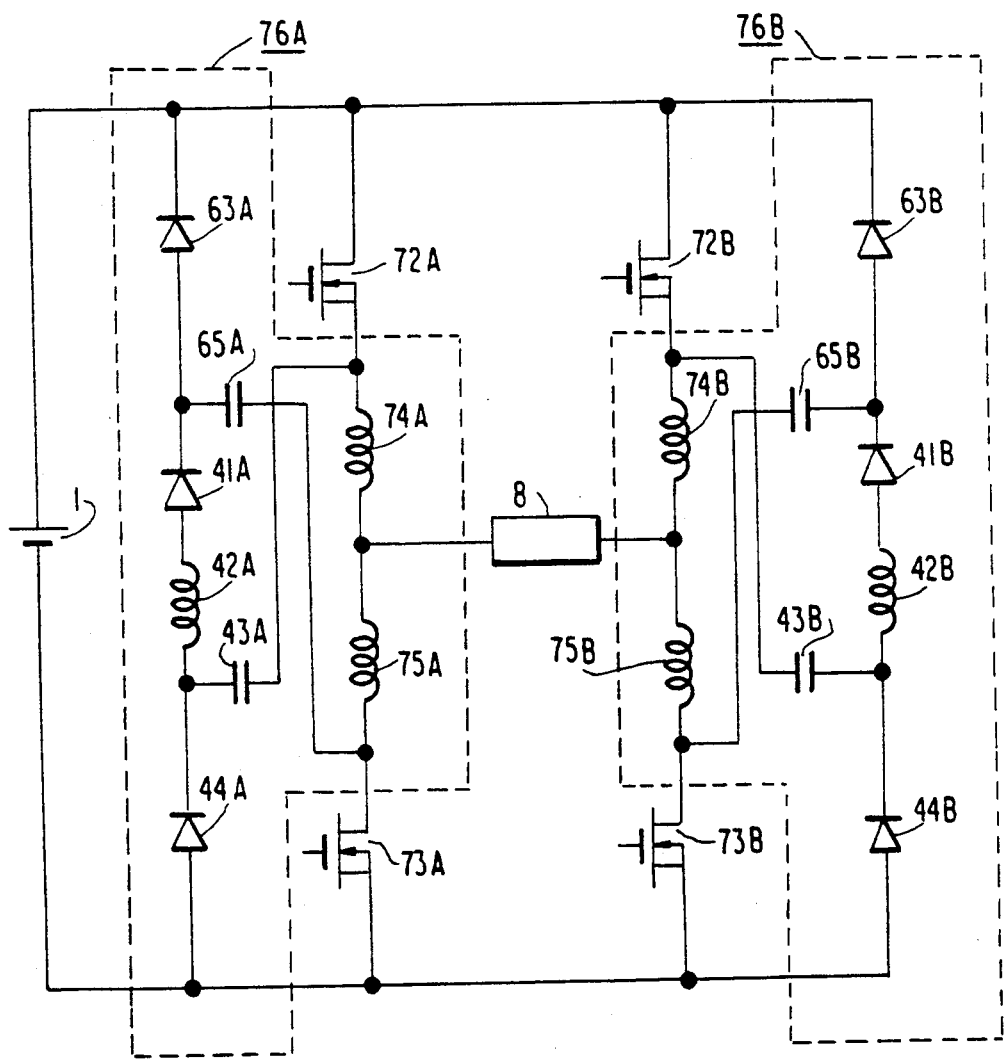
FIG. 16 is a circuit diagram of a single-phase inverter circuitry equipped with snubber circuits according to a thirteenth embodiment of the invention.

FIG. 16 shows another embodiment of the invention, i.e. snubber circuits used in a single-phase inverter circuitry. These circuits employ two half-bridge inverters in FIG. 14. In FIG. 16, a snubber circuit 76A comprises an inductor 75A, an inductor 74A, a diode 41A, an inductor 42A, a diode 44A, a capacitor 43A, a diode 63A and a capacitor 65A, and is connected to switching elements 72A, 73A. A snubber circuit 76B comprises an inductor 75B, an inductor 74B, a diode 41B, an inductor 42B, a diode 44B, a capacitor 43B, a diode 63B and a capacitor 65B, and is connected to switching elements 72B, 73B. Each snubber circuit operates in the same manner as the half-bridge snubber circuit 76 shown in FIG. 13. It should be noted that the inductors 75, 74 may be saturable reactors to produce an identical effect and may be coupled magnetically.

Figure 17:
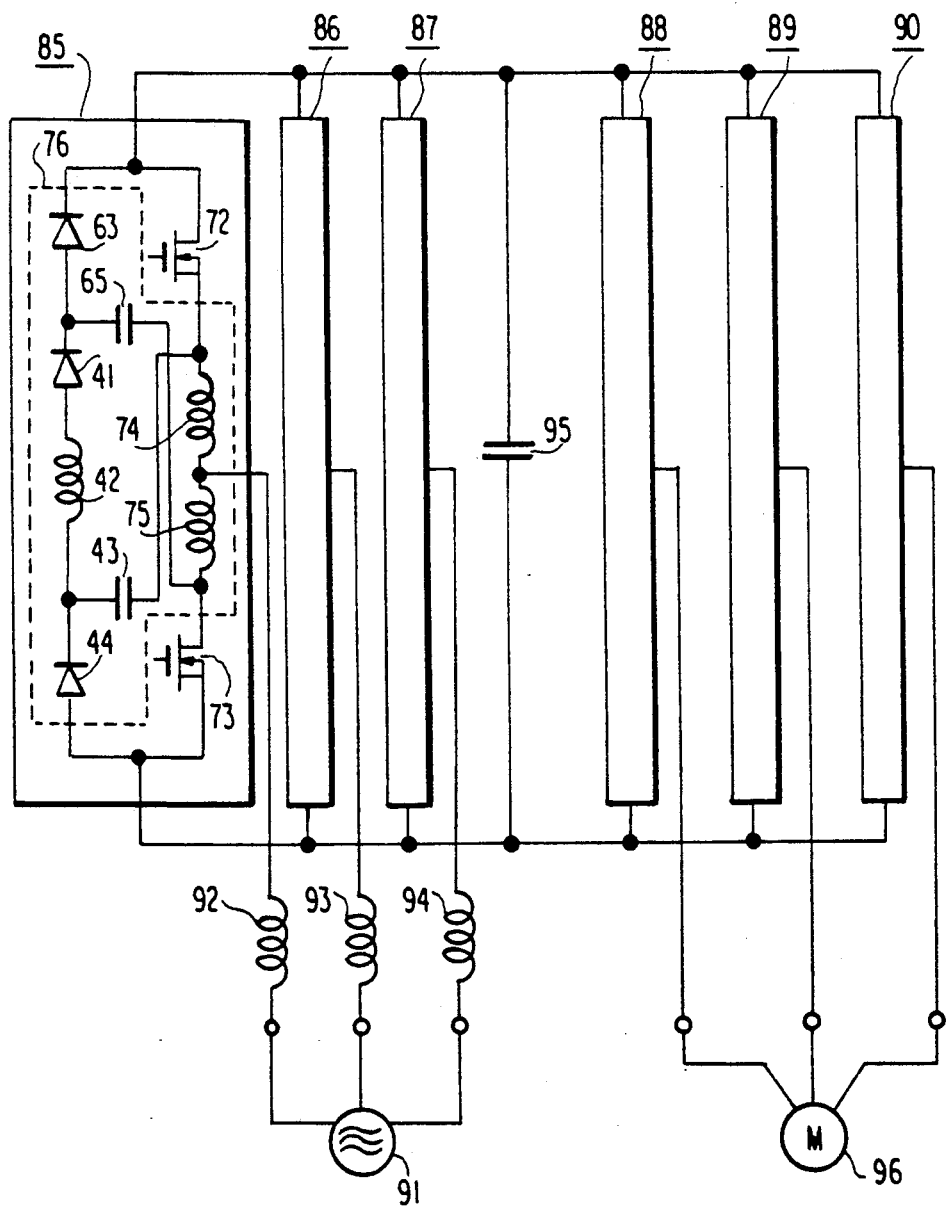
FIG. 17 is a circuit diagram of a motor driving inverter circuitry equipped with snubber circuits according to a further embodiment of the invention.
Figure 18:
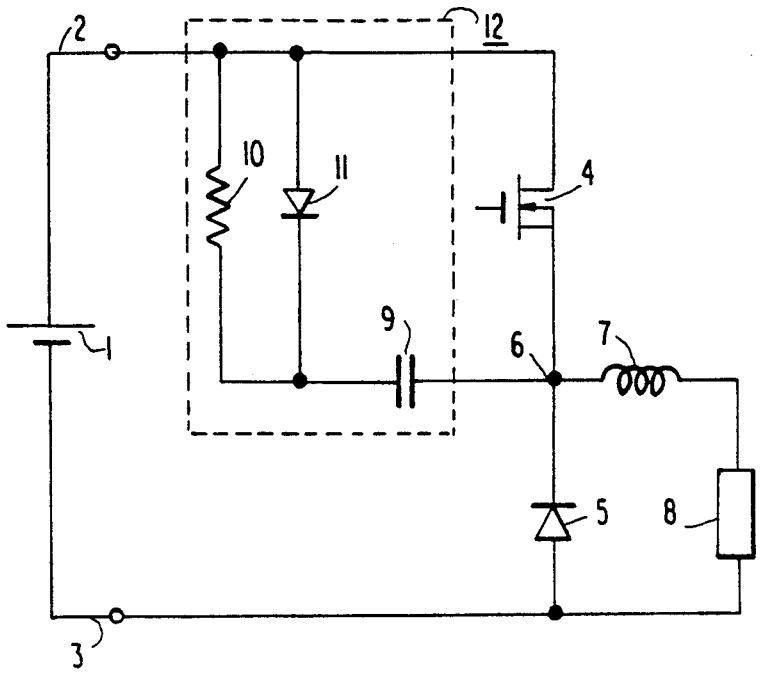
FIG. 18 is a circuit diagram of a voltage-dropping chopper circuitry equipped with a conventional snubber circuit.
Figure 20:
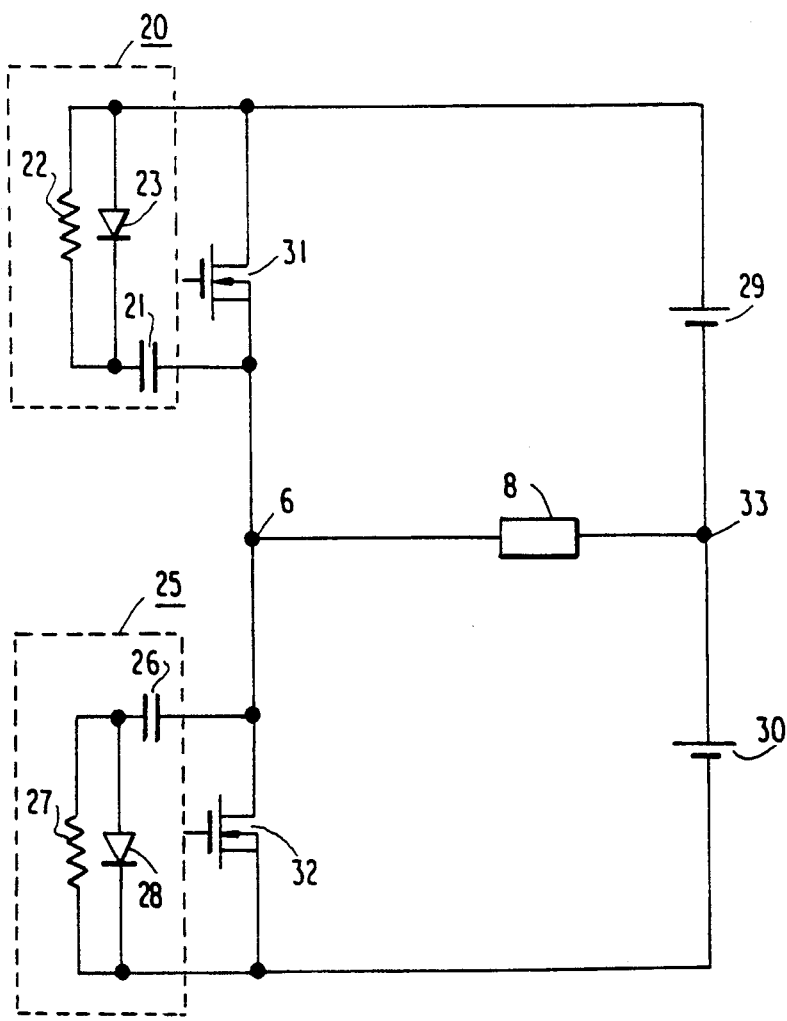
FIG. 20 is a circuit diagram of a half-bridge inverter circuitry equipped with the snubber circuit known in the art.

FIG. 17 illustrates a further embodiment of the invention, i.e. snubber circuits employed in a motor driving inverter using a three-phase converter circuit and a three-phase inverter circuit, wherein six half-bridge inverter circuits in FIG. 14 are employed. Referring to FIG. 17, reactors 92, 93 and 94 are connected between respective connection points Of a three-phase AC power supply 91 and inductors 74 and 75 in half-bridge inverters 85, 86, 87. The half-bridge inverters 85, 86, 87 rectify the voltage of the three-phase AC power supply 91 and charges a capacitor 95. Also, they return the charging energy of the capacitor 95 to the three-phase AC power supply 91 when the voltage of the capacitor 95 has exceeded a predetermined value.

Half-bridge inverters 88, 89, 90 operate by using the capacitor 95 as a DC power supply and are connected with a three-phase AC motor 96 at respective connection points of inductors 74 and 75 included in the half-bridge inverters 88, 89, 90. The rotation of the three-phase AC motor 96 is controlled by voltages output by the half-bridge inverters 88, 89, 90. The operation of each snubber circuit is as described in that of the half-bridge inverter snubber circuit 76 shown in FIG. 14.

The entire disclosure of each and every foreign patent application from which the benefit of foreign priority has been claimed in the present application is incorporated herein by reference, as if fully set forth.

Although this invention has been described in at least one preferred form with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. A snubber circuit for a power converter, which comprises a switching means with an input side and an output side connected to a DC power supply having power supply terminals, a load, a DC reactor means connected to said load, and a first diode connected to said DC power supply, comprising:
a first series circuit comprising a first inductor and said first diode, said DC reactor being connected to said first inductor and to the output side of said switching means,
a second series circuit comprising a second diode, a second inductor and a third diode, said second series circuit being connected across said DC power supply terminals, and
a capacitor connected between a connection point of said second inductor and said third diode and the output side of said switching means.

2. A snubber circuit for a power converter as defined in claim 1, wherein a fourth diode is inserted between a connection point of said first inductor and said first diode and a connection point of a first power supply terminal of said DC power supply and said switching means.

3. A snubber circuit for a power converter as defined in claim 1, wherein a second capacitor is inserted between a first power supply terminal of said DC power supply connected with said switching means and an end of said third diode connected to a second power supply terminal different in first power supply terminal.

4. A snubber circuit for a power converter as defined in claim 2, wherein a second capacitor is inserted between said first power supply terminal and an end of said third diode connected to a second power supply terminal different in polarity from said first power supply terminal.

5. A snubber circuit for a power converter as defined in claim 1, further comprising a second switching means, said second switching means being inserted between a connection point of said second diode and said second inductor and one end of said third diode.

6. A snubber circuit for a power converter as defined in claim 3, further comprising a second switching means, said second switching means being inserted between a connection point of said second diode and said second inductor and one end of said third diode.

7. A snubber circuit for a power converter as defined in claim 4, further comprising a second switching means, said second switching means being inserted between a connection point of said second diode and said second inductor and one end of said third diode.

8. A snubber circuit for a power converter, which comprises a DC power supply having power supply terminals, a switching element with an input side and a output side, said input side connected to said DC power supply a DC reactor means and a first diode connected to said DC power supply, comprising:
a first series circuit comprising a first inductor means for suppressing surge current and said first diode,
a second series circuit comprising a second diode, a second inductor means and a third diode, said second series circuit being connected across said DC power supply, and
a capacitor connected between a connection point of said second inductor means and said third diode and a connection point of said first series circuit and the output side of said switching element.

9. A snubber circuit for a power converter as defined in claim 8, further comprising a fourth diode inserted between the connection point of said first inductor means and said first diode and a first power supply terminal of said DC power supply connected with said switching element.

10. A snubber circuit for a power converter as defined in claim 8, further comprising a second capacitor inserted between a first power supply terminal of said DC power supply connected with said switching element and an end of said third diode connected to a second power supply terminal different in polarity from said first power supply terminal.

11. A snubber circuit for a power converter as defined in claim 9, further comprising a second capacitor inserted between said first power supply terminal and an end of said third diode connected to a second power supply terminal different in polarity from said first power supply terminal.

12. A snubber circuit for a power converter as defined in claim 8, further comprising a switching means, inserted between a connection point of said second diode and said second inductor means and one end of said third diode, for maintaining current through said second inductor means above a predetermined value.

13. A snubber circuit for a power converter as defined in claim 10, further comprising a second switching element inserted between a connection point of said second diode and said second inductor means and one end of said third diode.

14. A snubber circuit for a power converter as defined in claim 11, further comprising a second switching element inserted between a connection point of said second diode and said second inductor means and one end of said third diode.

15. A snubber circuit for a DC power converter, which comprises a switching element with an input and an output side, a DC reactor means and a first diode connected to a DC power supply having terminals said switching element being connected between said DC power supply and said DC reactor means, comprising:
a first inductor means for suppressing surge current and being connected between said switching element and said first diode,
a series circuit consisting of a second diode, a third diode, a second inductor means and a fourth diode connected across said DC power supply,
a first capacitor connected between a connection point of said second inductor means and said fourth diode and a connection point of said switching element and said first inductor means, and a second capacitor connected between a connection point of said second diode and said third diode and a connection point of said first inductor means and said first diode.

16. The snubber circuit of claim 15 wherein said second capacitor is selected to prevent overvoltage caused by resonance of said first diode.

17. The snubber circuit of claim 15 wherein said DC reactor is connected to said first inductor means.

18. A voltage reversible chopper circuit comprising first and second voltage dropping chopper circuits, each comprising the snubber circuit as set forth in claim 1 and providing to a common load the difference between said voltage dropping chopper circuits.

19. The snubber circuit of claim 1 wherein said power converter is one of a voltage-raising chopper type, a voltage dropping chopper type, a voltage reversible chopper type, a CUK type and a forward type.

20. A snubber circuit for a power converter for connection to a load, said power converter comprising a DC power supply and a first series circuit comprising a first switching element and a second switching element, said series circuit being connected across said DC power supply, comprising:
 a second series circuit comprising a first inductor means and a second inductor means connected at a connection point, said second series circuit being inserted within said first series circuit and having said connection point operative as a power supply point to said load,
 a third series circuit comprising a first diode and a second diode, a third inductor means and a third diode, said third series circuit being connected in parallel with said first series circuit,
 a first capacitor inserted between a connection point of said first switching element and said first inductor means and a connection point of said third inductor means and said third diode, and
 a second capacitor inserted between a connection point of said second inductor means and said second switching element and a connection point of said first diode and said second diode.

21. A power converter comprising a DC power supply and being operative to supply a load, said converter further comprising at least one switching circuit means and at least one snubber circuit means wherein:
 said switching circuit means comprises
 a first series circuit comprising a first switching element and a second switching element, said first series circuit being connected across said DC power supply,
 said snubber circuit means comprises
 a second series circuit comprising a first inductor means and a second inductor means connected at a connection point, said second series circuit being inserted within said first series circuit and having said connection point operative as a power supply point to said load,
 a third series circuit comprising a first diode and a second diode, a third inductor means and a third diode, said third series circuit being connected in parallel with said first series circuit,
 a first capacitor inserted between a connection point of said first switching element and said first inductor means and a connection point of said third inductor means and said third diode, and
 a second capacitor inserted between a connection point of said second inductor means and said second switching element and a connection point of said first diode and said second diode.

22. A power converter as set forth in claim 21 comprising a first plurality of said switching circuit means and a second plurality of said snubber circuit means.

23. A power converter as set forth in claim 22 wherein said load is connected between at least two of said snubber circuit means.

24. A power converter as set forth in claim 22 wherein each of said switching circuit means in said first plurality is paired with one of said snubber circuit means in said second plurality to form a third plurality of half-bridge inverters, one of said third plurality of inverters being connected to receive one phase of a three phase AC power supply means and another of said third plurality of inverters being connected for supplying a three phase motor.

* * * * *